US012062557B2

(12) United States Patent
Nanasaki et al.

(10) Patent No.: US 12,062,557 B2
(45) Date of Patent: Aug. 13, 2024

(54) SUBSTRATE PROCESSING SYSTEM AND PARTICLE REMOVAL METHOD

(71) Applicant: TOKYO ELECTRON LIMITED, Tokyo (JP)

(72) Inventors: Genichi Nanasaki, Miyagi (JP); Daisuke Hara, Miyagi (JP); Hideyuki Osada, Miyagi (JP); Hikaru Nihei, Miyagi (JP); Tatsuya Morioka, Hillsboro, OR (US); Akihiro Matsui, Mie (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 17/560,215

(22) Filed: Dec. 22, 2021

(65) Prior Publication Data

US 2022/0199435 A1 Jun. 23, 2022

(30) Foreign Application Priority Data

Dec. 22, 2020 (JP) .................................. 2020-212982
Nov. 12, 2021 (JP) .................................. 2021-185182

(51) Int. Cl.
*H01L 21/67* (2006.01)
*B08B 7/00* (2006.01)
(Continued)

(52) U.S. Cl.
CPC ...... *H01L 21/67167* (2013.01); *B08B 7/0035* (2013.01); *B08B 7/0064* (2013.01);
(Continued)

(58) Field of Classification Search
CPC ......... H01L 21/67167; H01L 21/67103; H01L 21/67109; H01L 21/67201;
(Continued)

(56) References Cited

U.S. PATENT DOCUMENTS 5,609,689 A * 3/1997 Kato ........................ C23C 14/50
414/217
5,766,824 A * 6/1998 Batchelder .............. G03F 7/168
430/327
(Continued)

FOREIGN PATENT DOCUMENTS

JP       2010-103443 A      5/2010
JP       2010103443 A   *  5/2010  ............... B08B 5/04
WO   WO-2015158384 A1 * 10/2015  ........... C23C 14/566

*Primary Examiner* — David G Cormier
*Assistant Examiner* — Thomas Bucci
(74) *Attorney, Agent, or Firm* — XSENSUS LLP

(57) ABSTRACT

A substrate processing system is disclosed, comprising: a vacuum transfer module; a substrate processing module connected to the vacuum transfer module and configured to process a substrate in a depressurized environment; a load-lock module connected to the vacuum transfer module; at least one substrate cooling stage disposed in the load-lock module; at least one substrate transfer robot disposed the vacuum transfer module and having at least one end effector; and a controller configured to control a particle removal operation. The operation includes: cooling at least one dummy substrate placed on said at least one substrate cooling stage to a first temperature; and holding said at least one end effector in any one of a plurality of positions in the vacuum transfer module or the substrate processing module for a first time period in a state where at least one cooled dummy substrate is placed on said at least one end effector.

24 Claims, 11 Drawing Sheets

(51) Int. Cl.
   *H01L 21/677* (2006.01)
   *H01L 21/683* (2006.01)

(52) U.S. Cl.
   CPC ...... *B08B 7/0071* (2013.01); *H01L 21/67103* (2013.01); *H01L 21/67109* (2013.01); *H01L 21/67201* (2013.01); *H01L 21/67742* (2013.01); *H01L 21/6838* (2013.01)

(58) Field of Classification Search
   CPC .......... H01L 21/67742; H01L 21/6838; H01L 21/67745; H01L 21/67748; H01L 21/67155; H01L 21/67184; H01L 21/68707; H01L 21/68742; H01L 21/6875; H01J 37/32798; H01J 2237/335; B08B 7/0035; B08B 7/0064; B08B 7/0071
   See application file for complete search history.

(56) References Cited

U.S. PATENT DOCUMENTS

| | | | | | |
|---|---|---|---|---|---|
| 5,882,413 | A * | 3/1999 | Beaulieu | ............ | H01L 21/67748 118/724 |
| 6,486,444 | B1 * | 11/2002 | Fairbairn | ............ | H01L 21/67196 118/724 |
| 6,530,732 | B1 * | 3/2003 | Theriault | ............ | H01L 21/67196 165/80.1 |
| 8,945,313 | B2 * | 2/2015 | Matsui | ............ | C23C 16/4401 134/22.12 |
| 10,115,611 | B2 * | 10/2018 | Sakaue | ............ | H01L 21/67742 |
| 10,468,278 | B2 * | 11/2019 | Ishizawa | ............ | H01L 21/67745 |
| 10,643,825 | B2 * | 5/2020 | Tetsuka | ............ | H01J 37/32449 |
| 2002/0020355 | A1 * | 2/2002 | Saeki | ............ | H01L 21/67766 118/719 |
| 2003/0102084 | A1 * | 6/2003 | Livesay | ............ | H01L 21/67225 156/345.31 |
| 2006/0171095 | A1 * | 8/2006 | Park | ............ | H01L 21/67745 361/234 |
| 2007/0196011 | A1 * | 8/2007 | Cox | ............ | H01L 21/67167 382/145 |
| 2007/0267144 | A1 * | 11/2007 | Inagawa | ............ | H01L 21/67109 156/345.51 |
| 2007/0280816 | A1 * | 12/2007 | Kurita | ............ | H01L 21/67201 414/806 |
| 2010/0101608 | A1 * | 4/2010 | Matsui | ............ | B08B 7/02 134/105 |
| 2010/0104760 | A1 * | 4/2010 | Matsui | ............ | C23C 16/4401 427/294 |
| 2010/0326637 | A1 * | 12/2010 | Sasaki | ............ | H01L 21/67109 118/695 |
| 2011/0304078 | A1 * | 12/2011 | Lee | ............ | H01L 21/67201 264/344 |
| 2012/0211029 | A1 * | 8/2012 | Pandit | ............ | B08B 5/00 134/21 |
| 2013/0039734 | A1 * | 2/2013 | Englhardt | ............ | H01L 21/67109 392/407 |
| 2013/0224953 | A1 * | 8/2013 | Salinas | ............ | H01L 21/02063 156/345.31 |
| 2013/0248014 | A1 * | 9/2013 | Kobayashi | ............ | H01L 21/67109 137/334 |
| 2017/0117169 | A1 * | 4/2017 | Sakaue | ............ | H01L 21/67742 |
| 2019/0108987 | A1 * | 4/2019 | Tetsuka | ............ | H01J 37/32449 |

* cited by examiner

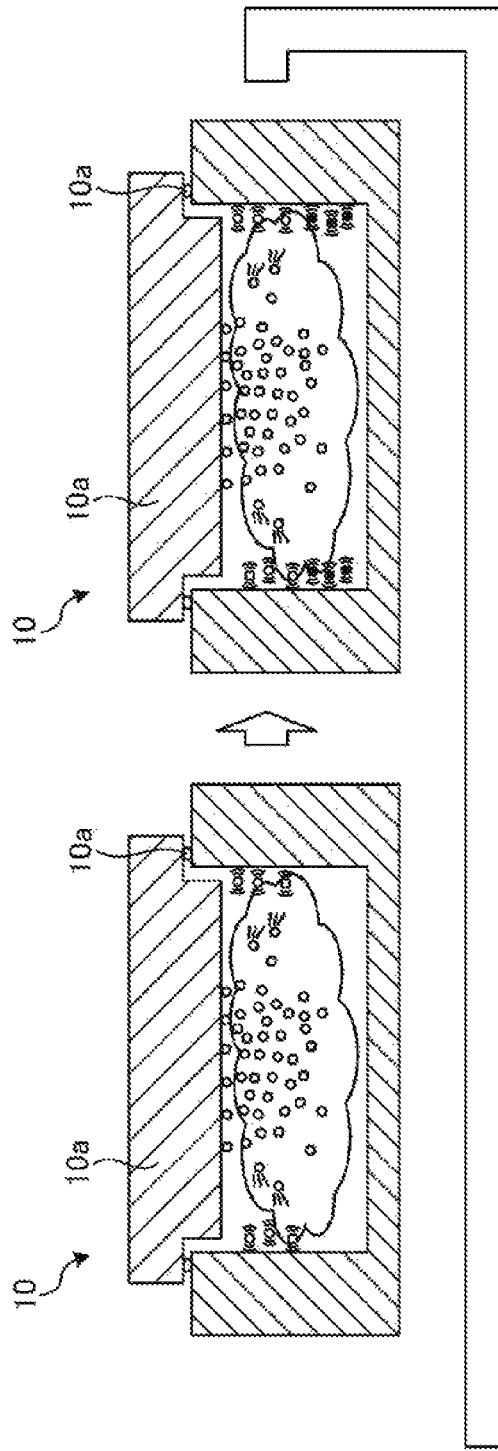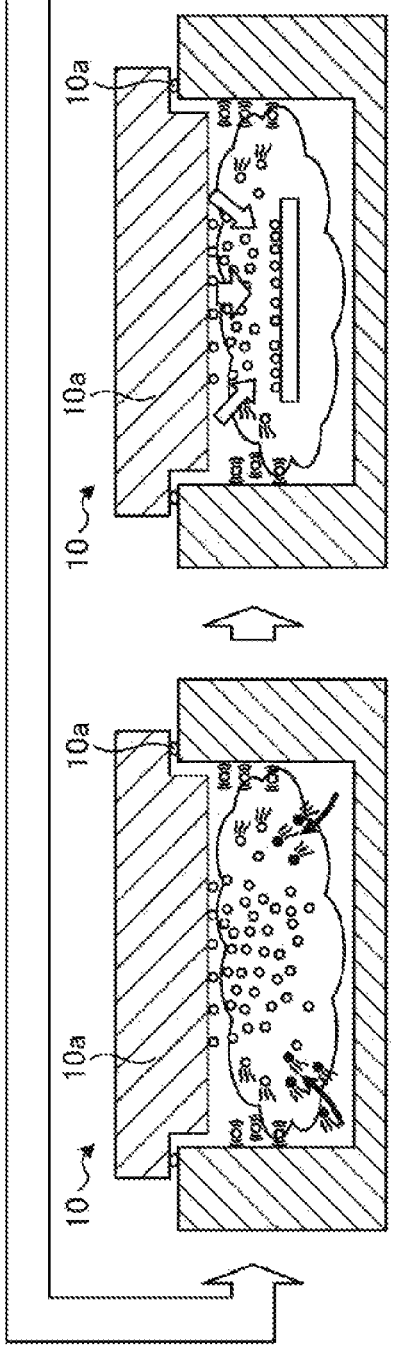

SUBSTRATE PROCESSING SYSTEM AND PARTICLE REMOVAL METHOD

CROSS-REFERENCE TO RELATED APPLICATIONS

This application claims priority to Japanese Patent Application Nos. 2020-212982 filed on Dec. 22, 2020 and 2021-185182 filed on Nov. 12, 2021, respectively, the entire contents of which are incorporated herein by reference.

TECHNICAL FIELD

The present disclosure relates to a substrate processing system and a particle removal method.

BACKGROUND

Japanese Patent Publication No. 2010-103443 discloses a technique for collecting particles by evacuating a chamber while cooling a protective member disposed to cover an upper surface of a stage in the chamber using a cooling attraction portion, such as a Peltier element or the like, disposed in the protective member.

SUMMARY

The present disclosure provides a technique for removing particle causes from a storage chamber from which particles will be removed without the need of providing a cooling mechanism in the storage chamber.

To this end, substrate processing system is provided, comprising: a vacuum transfer module; a substrate processing module connected to the vacuum transfer module and configured to process a substrate in a depressurized environment; a load-lock module connected to the vacuum transfer module; at least one substrate cooling stage disposed in the load-lock module;

at least one substrate transfer robot disposed the vacuum transfer module and having at least one end effector; and a controller configured to control a particle removal operation, wherein the particle removal operation includes: (a) cooling at least one dummy substrate placed on said at least one substrate cooling stage to a first temperature of 5° C. to 20° C.; and (b) holding said at least one end effector in any one of a plurality of positions in the vacuum transfer module or in the substrate processing module for a first time period of 30 seconds or longer in a state where at least one cooled dummy substrate is placed on said at least one end effector.

BRIEF DESCRIPTION OF THE DRAWINGS

The objects and features of the present disclosure will become apparent from the following description of embodiments, given in conjunction with the accompanying drawings, in which:

FIGS. 4A to 4D illustrate a particle removal sequence according to an embodiment;

DETAILED DESCRIPTION

Hereinafter, embodiments of a substrate processing system and a particle removal method of the present disclosure will be described in detail with reference to the accompanying drawings. Further, the following embodiments are not intended to limit the substrate processing system and the particle removal method.

The substrate processing system includes a storage chamber set to a predetermined depressurized state during substrate processing, such as a process module for performing substrate processing, a vacuum transfer chamber for transferring a substrate to the process module, or the like. In the substrate processing system, when the storage chamber such as the process module, the vacuum transfer chamber, or the like is opened to the atmosphere for maintenance or the like, moisture in the atmosphere is attached to an inner wall of the storage chamber. Even if the storage chamber is evacuated, therefore, the moisture remains in the storage chamber, and may cause particles on a substrate. Therefore, as described in Japanese Patent Application Publication No. 2010-103443, the particles may be removed by collecting particle causes, such as moisture and the like, by cooling a stage disposed in a process module and having therein a cooling adsorption portion or a protective member provided with a cooling adsorption portion. However, it is required to provide a cooling mechanism in the storage chamber from which the particles will be removed, which complicates the configuration.

Therefore, it is desired to develop a technique for removing particle causes from the storage chamber without the need of providing a cooling mechanism in the storage chamber from which particles will be removed.

Embodiment (Substrate Processing System 1)

Figure 1:
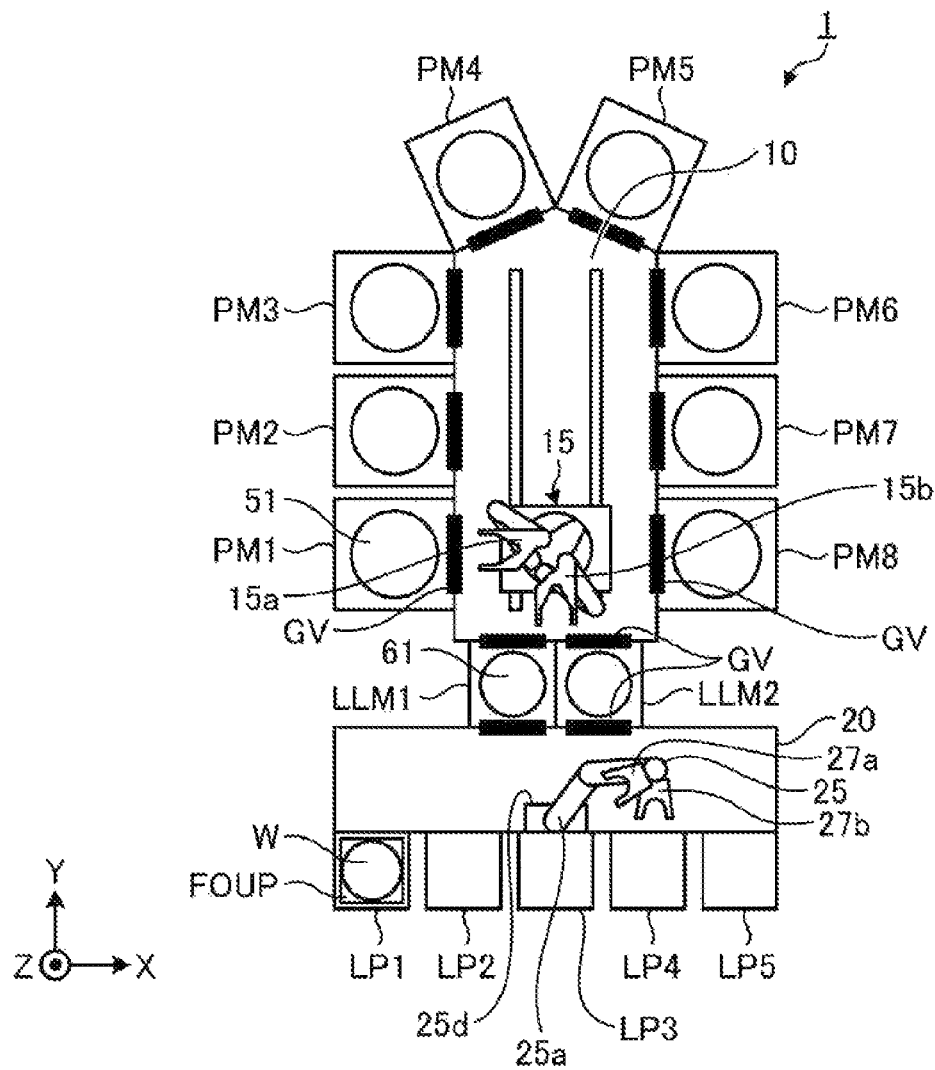
FIG. 1 shows a schematic configuration of a substrate processing system according to an embodiment.

Next, an embodiment will be described. FIG. 1 shows a schematic configuration of a substrate processing system 1 according to an embodiment. The substrate processing system 1 includes a plurality of vacuum processing chambers (hereinafter, also referred to as "process modules") PM1 to PM8, a vacuum transfer chamber 10, and a normal pressure transfer chamber 20. The substrate processing system 1 further includes a plurality of load-lock modules LLM1 to LLM2, a plurality of load ports LP1 to LP5, and a controller 30.

In the example of FIG. 1, eight process modules PM1 to PM8, two load-lock modules LLM1 to LLM2, and five load ports LP1 to LP5 are illustrated. However, the number of the process modules PM, the number of the load-lock modules LLM, and the number of the load ports LP of the substrate processing system 1 are not limited to those in FIG. 1. Hereinafter, the eight process modules PM1 to PM8 are collectively referred to as "process modules PM" unless otherwise stated. Similarly, the two load-lock modules LLM1 to LLM2 are collectively referred to as "load-lock modules LLM." Similarly, the five load ports LP1 to LP5 are collectively referred to as "load ports LP." The substrate processing system 1 according to the embodiment includes at least two load-lock modules LLM.

The process modules PM are airtightly configured, and can be exhausted to a depressurized state by an exhaust mechanism. In each of the process modules PM, substrate processing, such as etching, film formation, or the like, is performed on a substrate W in a predetermined depressurized atmosphere suitable for the substrate processing. The substrate W is, e.g., a semiconductor wafer. Each of the process modules PM has therein a stage 51 for supporting the substrate W. Each of the process modules PM is maintained in a depressurized atmosphere during the substrate processing. The process modules PM are connected to the vacuum transfer chamber 10 through gate valves GV that can be opened and closed.

The vacuum transfer chamber 10 is airtightly configured, and can be exhausted to a depressurized state by the exhaust mechanism. In the vacuum transfer chamber 10, the substrate W is transferred in a predetermined depressurized atmosphere. For example, the vacuum transfer chamber 10 has therein a first transfer mechanism 15 for transferring the substrate W. The first transfer mechanism 15 has an extensible/contractible robot arm. At least one first transfer mechanism 15 is disposed in the vacuum transfer chamber 10 and has at least one end effector. The first transfer mechanism 15 according to the embodiment has a first arm 15a and a second arm 15b that can operate individually. Each of the first arm 15a and the second arm 15b has a substantially U-shaped pick at the tip thereof, and is configured to hold the substrate W. In the present embodiment, the first transfer mechanism 15 corresponds to a substrate transfer robot of the present disclosure. Further, the picks of the first arm 15a and the second arm 15b correspond to the end effectors of the present disclosure, i.e., a first end effector and a second end effector. The first transfer mechanism 15 extends and contracts its robot arm to transfer the substrate W between the process modules PM1 to PM8 and the load-lock modules LLM1 and LLM2. The substrate W is transferred to each of the process modules PM via the vacuum transfer chamber 10. The substrate W processed in a certain process modules PM can be transferred via the vacuum transfer chamber 10 to another process module PM for performing subsequent processing. The substrate W that has been subjected to all processing is transferred to the load-lock module LLM via the vacuum transfer chamber 10.

Each of the load-lock modules LLM is airtightly configured, and can be switched between an atmospheric atmosphere and a depressurized atmosphere by the exhaust mechanism. The load-lock modules LLM are arranged side by side along one side of the vacuum transfer chamber 10 where the process modules PM are not disposed. The load-lock modules LLM and the vacuum transfer chamber 10 can communicate through the gate valves GV. The load-lock modules LLM, at a side opposite to the side connected to the vacuum transfer chamber 10, are connected to the normal pressure transfer chamber 20. The load-lock modules LLM and the normal pressure transfer chamber 20 can communicate with each other through the gate valves GV.

Figure 2:
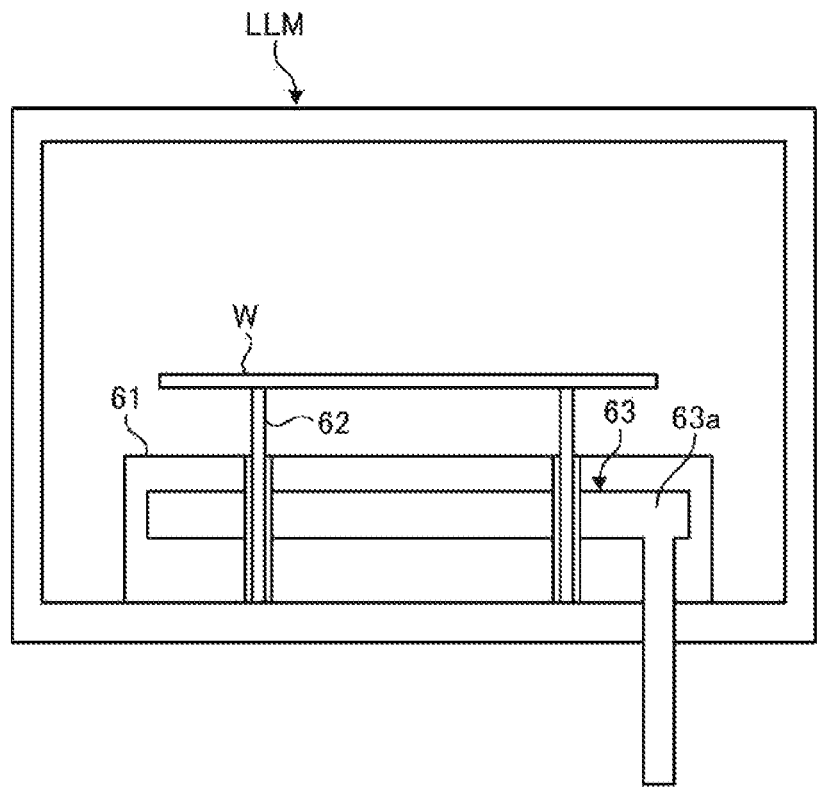
FIG. 2 shows a schematic configuration of a load-lock module LLM according to an embodiment.

FIG. 2 shows a schematic configuration of the load-lock module LLM according to an embodiment. The load-lock module LLM has therein a stage 61 for placing thereon the substrate W. The stage 61 is provided with support pins 62 and a cooling device 63. The support pins 62 can be raised and lowered to raise and lower the substrate W with respect to the stage 61. The cooling device 63 has a channel 63a formed in the stage 61. The cooling device 63 cools the stage 61 by circulating a cooled coolant, such as a chiller or the like, from an external chiller or the like, through the channel 63a. In the load-lock module LLM, the substrate W placed on the stage 61 can be cooled while the stage 61 is cooled by using the cooling device 63. The cooling device 63 may have any configuration as long as the substrate W can be cooled. For example, the cooling device 63 may be a Peltier element or the like.

Referring back to FIG. 1, the normal pressure transfer chamber 20 is maintained in a normal pressure atmosphere. The load-lock modules LLM are arranged side by side on one side of the normal pressure transfer chamber 20. Further, the load ports LP are arranged side by side on the other side of the normal pressure transfer chamber 20. The normal pressure transfer chamber 20 has therein a second transfer mechanism 25 for transferring an object to be transferred between the load-lock modules LLM and the load ports LP. The second transfer mechanism 25 has an arm 25a. The arm 25a is rotatably fixed on a base 25d. The base 25d is fixed near a load port LP3. A first pick 27a and a second pick 27b, each having a substantially U shape, are rotatably connected to the tip end of the arm 25a.

The load port LP is configured such that a storage container (hereinafter, also referred to as "front opening unified pod (FOUP)") accommodating the substrate W can be placed thereon. The FOUP is the storage container that can accommodate the substrate W. The FOUP has a lid (not shown) that can be opened and closed. When the FOUP is placed on the load port LP, the lid of the FOUP and a door of the load port LP are engaged. If the door of the load port LP is opened in that state, the lid of the FOUP moves together with the door of the load port LP. Accordingly, the FOUP is opened, and the FOUP and the normal pressure transfer chamber 20 communicate with each other through the load port LP.

The process modules PM, the vacuum transfer chamber 10, the first transfer mechanism 15, the load-lock modules LLM, the normal pressure transfer chamber 20, the second transfer mechanism 25, and the load ports LP configured as described above are connected to and controlled by the controller 30.

The controller 30 is an information processing device such as a computer or the like. The controller 30 controls individual components of the substrate processing system 1. Specific configuration and function of the controller 30 are not particularly limited. The controller 30 includes, e.g., a storage 31, a processor 32, an input/output interface (IO I/F) 33, and a display 34. The storage 31 is, e.g., any storage device such as a hard disk, an optical disk, a semiconductor memory device, or the like. The processor 32 is, e.g., a processor such as a central processing unit (CPU), a micro processing unit (MPU), or the like. The display 34 is a functional device for displaying information, such as a liquid crystal screen, a touch panel, or the like. The processor 32 reads out and executes a program or a recipe stored in the storage 31 to control the individual components of the substrate processing system 1 through the input/output interface 33.

In the substrate processing system 1, when the storage chambers, such as the process modules PM, the vacuum transfer chamber 10, and the like, are opened to the atmosphere for maintenance or the like, particles may be generated on the substrate W. These particles include, e.g., fine pieces that have entered the storage chamber when the storage chambers are opened to the atmosphere. In addition, there can be particles generated by moisture attached to the inner wall of the storage chamber and remaining in the storage chamber even after the evacuation which is condensed on defective portions of the substrate or the like. Hereinafter, the particles generated by condensation of moisture are also referred to as "condensation particles".

Therefore, in the present embodiment, the particle causes are removed from the storage chamber by the following sequence. Hereinafter, an example case will be described in which the storage chamber from which particles will be removed is the vacuum transfer chamber 10 and particles to be removed are the ones generated by opening the vacuum transfer chamber 10 to the atmosphere.

(Particle Removal Method)

Figure 3:
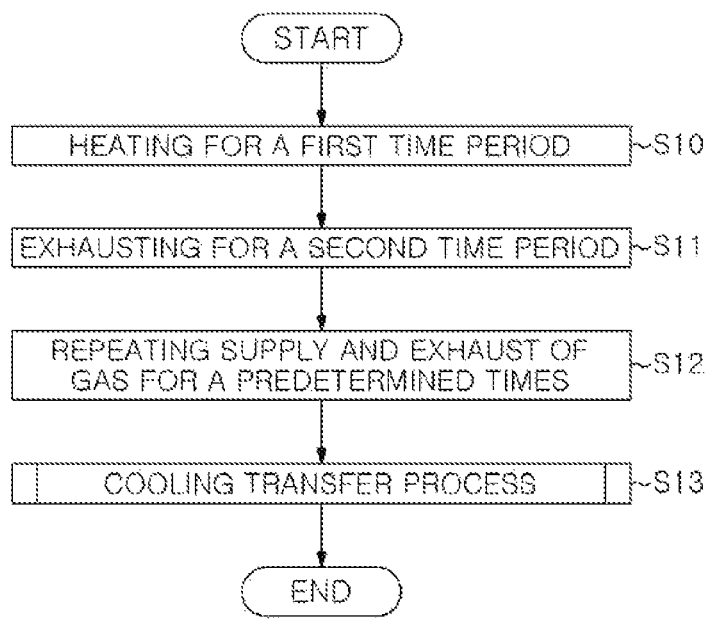
FIG. 3 is a flowchart showing a sequence of a particle removal method according to an embodiment.

FIG. 3 is a flowchart showing a sequence of a particle removal method according to an embodiment. The processes of the particle removal method according to the embodiment are performed when the controller 30 executes a predetermined operation for instructing removal of particles is performed, for example. FIGS. 4A to 4D illustrate a sequence of particle removal according to the embodiment. FIGS. 4A to 4D schematically show changes in an internal state of the vacuum transfer chamber 10 in the case of performing the particle removal method according to the embodiment.

As shown in FIGS. 4A to 4D, the vacuum transfer chamber 10 is formed in a box shape, and has a removable ceiling plate 10a at an upper portion thereof. The maintenance of the vacuum transfer chamber 10 is performed after removing the ceiling plate 10a. The vacuum transfer chamber 10 is opened to the atmosphere by the removal of the ceiling plate 10a, and moisture in the atmosphere is attached to the inner wall of the vacuum processing chamber 10. After the maintenance is completed, the ceiling plate 10a is attached. The vacuum transfer chamber 10 is airtightly sealed by attaching the ceiling plate 10a and providing a sealing member 10b, such as a seal or the like, at a contact portion of the ceiling plate 10a.

First, the vacuum transfer chamber 10 is heated for a predetermined first time period (step S10). For example, the vacuum transfer chamber 10 is heated by providing a heater around the vacuum transfer chamber 10 or by increasing temperatures of the process modules PM around the vacuum transfer chamber 10 under the control of the controller 30. For example, the vacuum transfer chamber 10 is heated to 50° C. to 70° C. The first time period is set to, e.g., 3 hours or more. Accordingly, a condensation core, such as moisture, particles, or the like, that causes condensation on the substrate W is activated. For example, the moisture attached to the inner wall is released into the vacuum transfer chamber 10 by heat (FIG. 4A).

Next, the vacuum transfer chamber 10 is exhausted for a predetermined second time period (step S11). For example, the controller 30 controls the vacuum transfer chamber 10 to exhaust the vacuum transfer chamber 10 for the second time period. The second time period is set to, e.g., 6 hours or more. Accordingly, the released moisture and the like are discharged (FIG. 4B).

Next, the supply of a predetermined gas into the vacuum transfer chamber 10 and the exhaust of the gas using the exhaust mechanism are repeated a plurality of times (step S12). For example, the controller 30 controls the vacuum transfer chamber 10 to repeat the supply of gas and the exhaust of gas 10 times. For example, $N_2$ gas may be supplied. The inner wall of the vacuum transfer chamber 10 that is coated with a thermal spray material, such as alumina or the like, has fine holes, and moisture or particles, such as fine pieces and the like, have entered the inner wall. The moisture or the particles that have entered the wall surface are discharged and exhausted by the impact of the supply of gas and the exhaust of gas (FIG. 4C).

Next, a cooling transfer process of cooling the substrate W and transferring the cooled substrate W into the vacuum transfer chamber 10 is performed (step S13). Accordingly, moisture is condensed on the cooled substrate W, and the particle causes, such as moisture and the like, are removed from the vacuum transfer chamber 10 (FIG. 4D).

Figure 5:
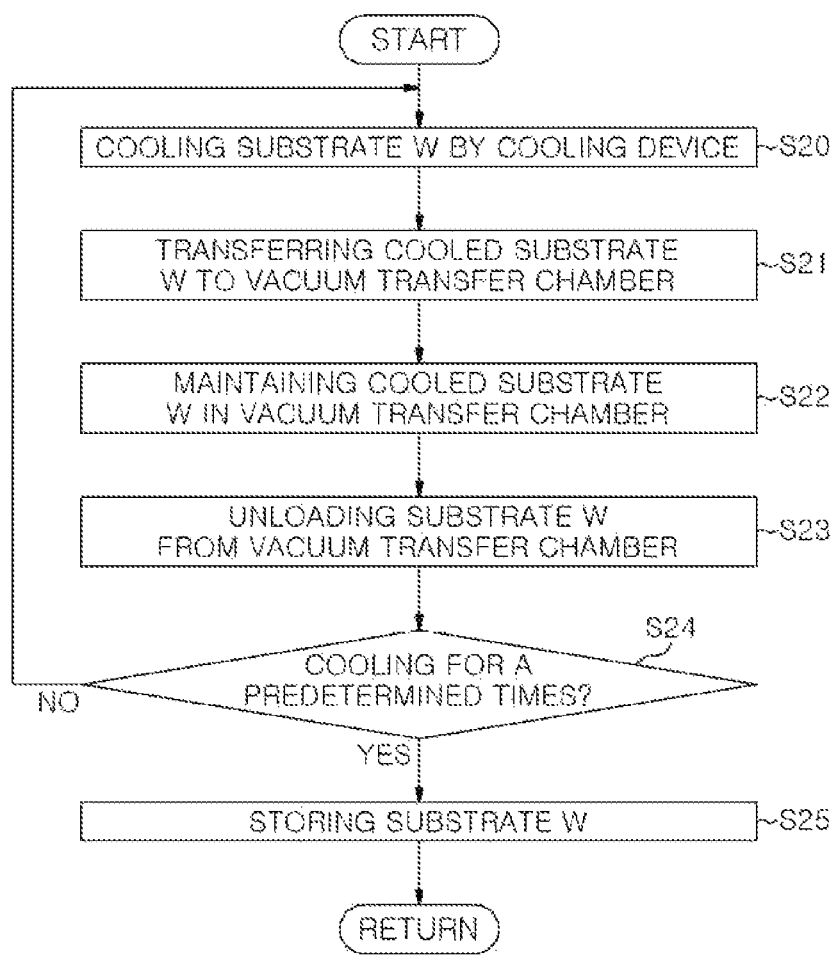
FIG. 5 is a flowchart showing a sequence of a cooling transfer process according to an embodiment.
Figure 6A:
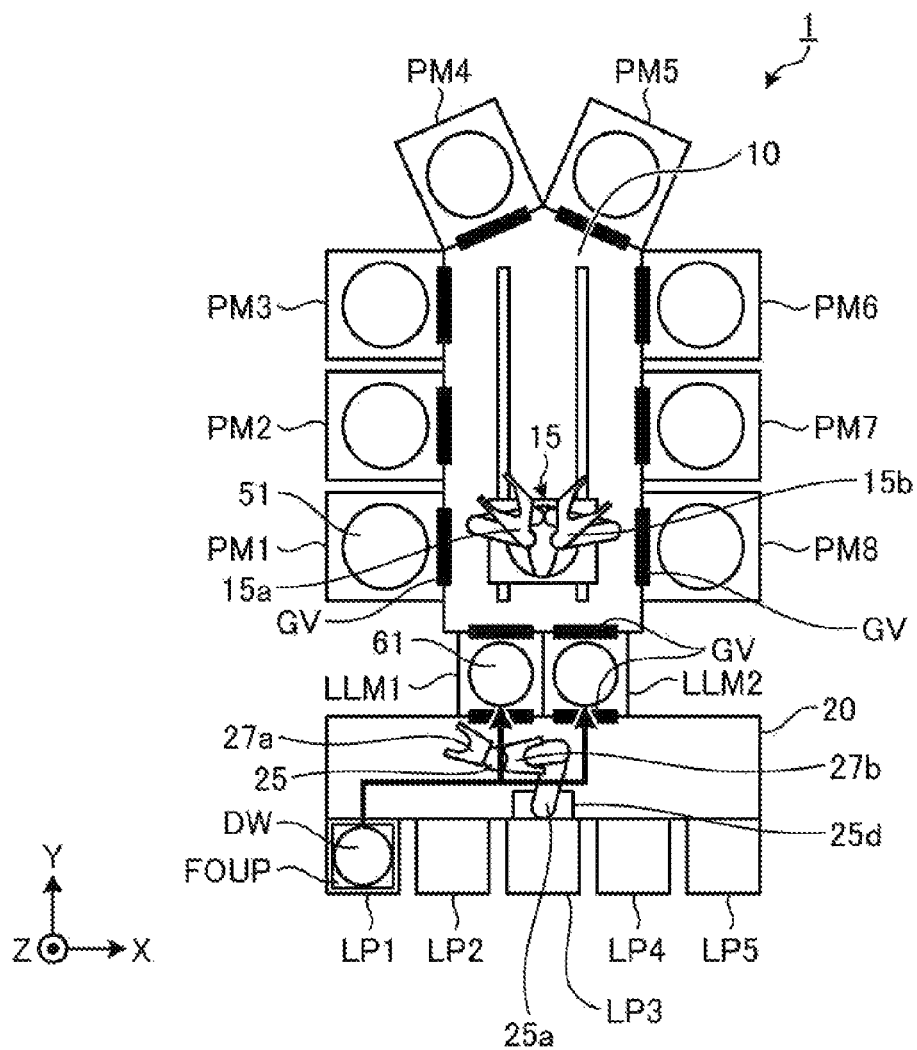
FIGS. 6A to 6D illustrate a transfer flow of a substrate W in the cooling transfer process according to the embodiment.
Figure 6B:
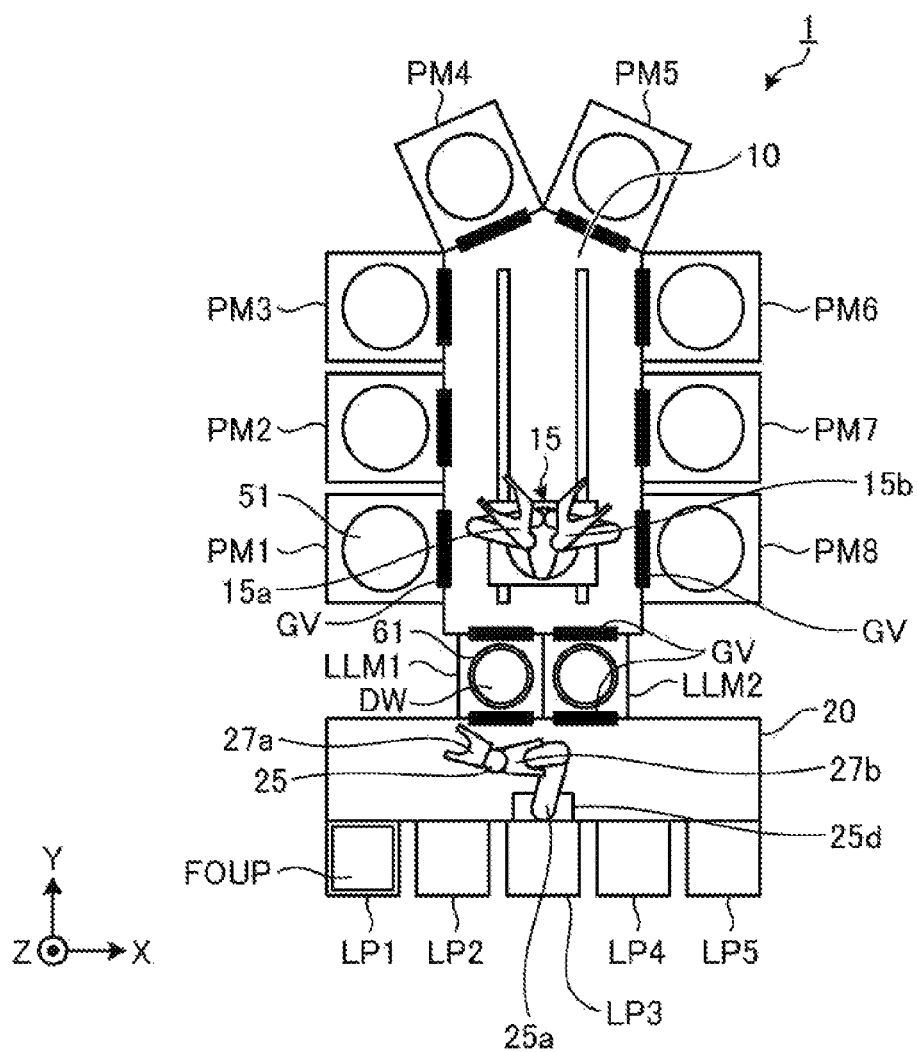
Figure 6C:
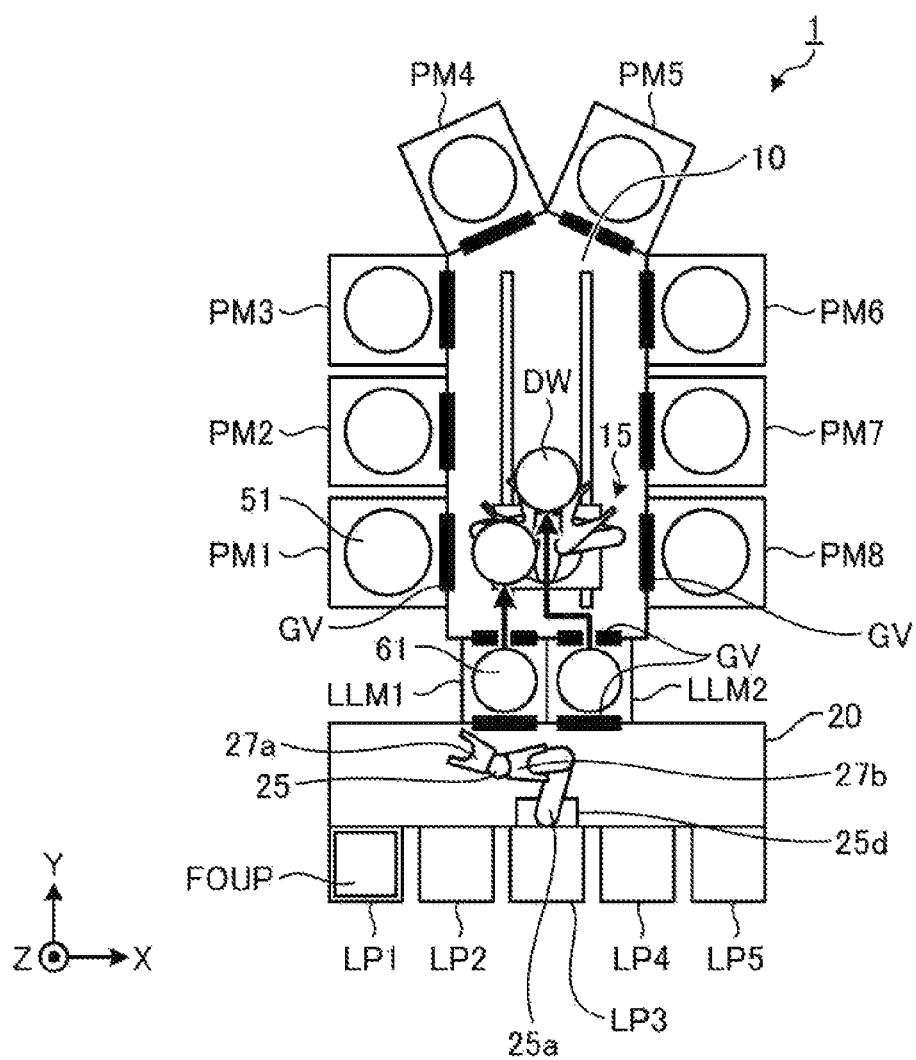
Figure 6D:
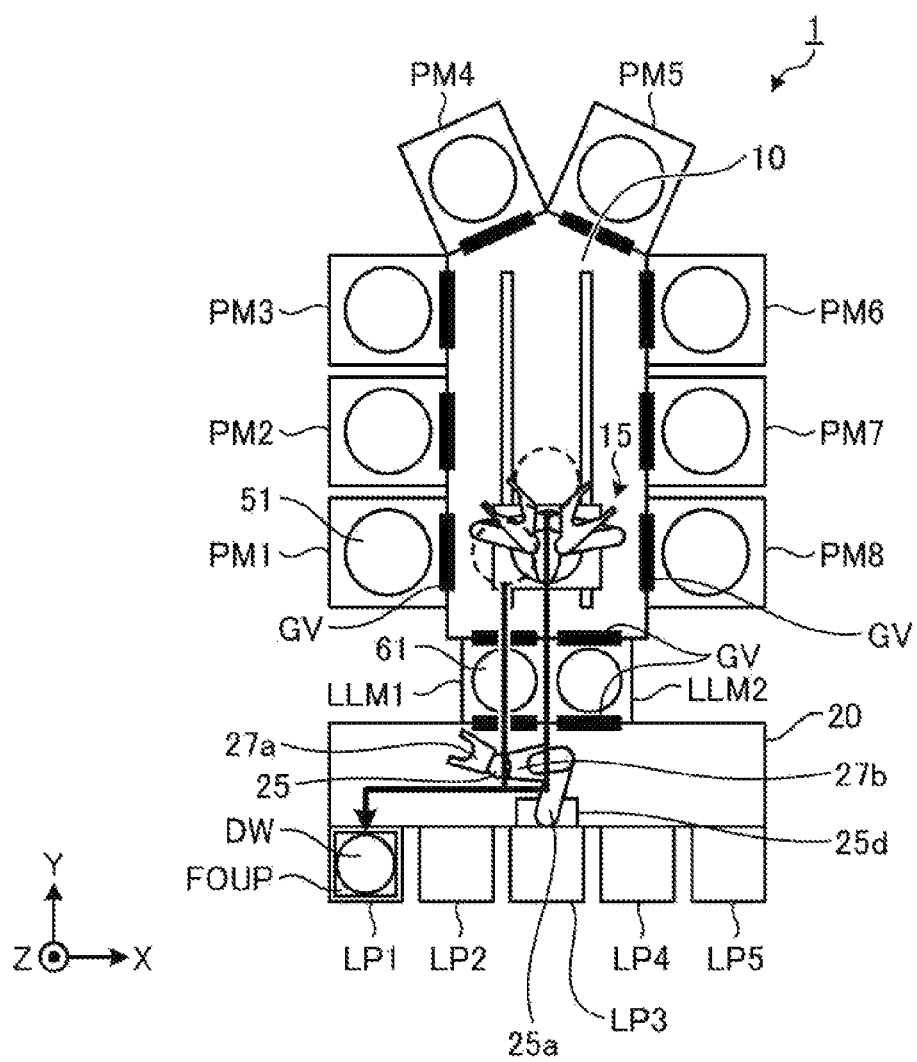

Next, the cooling transfer process shown in step S13 of FIG. 3 will be described. FIG. 5 is a flowchart showing a sequence of the cooling transfer process according to the embodiment. FIGS. 6A to 6D illustrate a transfer flow of the substrate W in the cooling transfer process according to the embodiment.

The substrate W is transferred to the load-lock module LLM and cooled by the cooling device 63 (step S20). For example, the controller 30 controls the normal pressure transfer chamber 20 and the load-lock module LLM, such that the second transfer mechanism 25 transfers the substrate W from the load port LP to the stage 61 of the load-lock module LLM. In the load-lock module LLM, the stage 61 is cooled by circulation of the cooled coolant from the external chiller through the cooling device 63. The substrate W placed on the stage 61 is cooled by the contact with the stage 61. The substrate W is cooled such that the temperature difference between the substrate W and the vacuum transfer chamber 10 becomes 20° C. or more, and more preferably 25° C. or more. For example, the controller 30 sets the temperature of the coolant from the chiller to be lower than the temperature of the vacuum transfer chamber 10 by 20° C. or more, and more preferably 25° C. or more. Accordingly, the substrate W is cooled such that the temperature difference between the substrate W and the vacuum transfer chamber 10 becomes 20° C. or more, and more preferably 25° C. or more. For example, the temperature of the wall constituting the vacuum transfer chamber 10 at the time of transferring a cooled dummy wafer DW and removing particles is set to about 25° C. to 40° C. The controller 30 circulates the cooled coolant from the chiller through the cooling device 63 to cool the substrate W to 5° C. to 20° C., more preferably 10° C. to 15° C.

The substrate W used for removing particle causes may be a semiconductor wafer, a dummy wafer having the same characteristics as those of the semiconductor wafer, or a substrate dedicated for particle removal. For example, in FIG. 6A, the FOUP in which the dummy wafer DW is set as the substrate W is set on the load port LP. The second transfer mechanism 25 takes out two dummy wafers DW from the FOUP and transfers them to the stages 61 of the load-lock modules LLM. In the load-lock modules LLM, the support pins 62 are raised to receive the dummy wafers DW from the second transfer mechanism 25 and lowered to bring the dummy wafers DW into contact with the stages 61 to cool the dummy wafers DW. In the load-lock modules LLM, it is preferable to cool the dummy wafers DW in a normal pressure state (atmospheric atmosphere) without decreasing a pressure therein. Accordingly, the dummy wafers DW can be efficiently cooled.

The cooled substrate W is transferred to the vacuum transfer chamber 10 (step S21). For example, the controller 30 controls the load-lock modules LLM such that the load-lock modules LLM are depressurized and switched to a depressurized atmosphere. Then, the controller 30 opens the gate valves GV, and controls the vacuum transfer chamber 10 such that the substrate W is transferred to the vacuum transfer chamber 10 by the first transfer mechanism 15. For example, in FIG. 6B, two cooled dummy wafers DW are transferred from the load-lock modules LLM to the vacuum transfer chamber 10.

The state in which the cooled substrate W is disposed in the vacuum transfer chamber 10 is maintained for a predetermined time period or longer (step S22). For example, the controller 30 controls the vacuum transfer chamber 10 such that the substrate W is transferred to the vicinity of the sidewall of the vacuum transfer chamber 10 by the first transfer mechanism 15 and maintained in that state for a predetermined period or longer. The predetermined time period in which the substrate W is maintained is preferably 30 seconds or longer, and more preferably 60 seconds or longer. When there are multiple cooled substrates W, the substrates W may be transferred to different positions. For example, in FIG. 6C, one of the two cooled dummy wafers DW is transferred to the vicinity of the loading/unloading port in the vacuum transfer chamber 10 with respect to the process module PM, and the other is transferred to the vicinity of the central portion in the vacuum transfer chamber 10 and held in that position at least for a predetermined period of time. Accordingly, moisture is condensed and attached to each of the dummy wafers DW.

The substrate W is unloaded from the vacuum transfer chamber 10 (step S23). For example, the controller 30 controls the vacuum transfer chamber 10 such that the substrate W is transferred to the load-lock module LLM by the first transfer mechanism 15.

It is determined whether or not the cooling of the substrate W has been performed a predetermined number of times (step S24). For example, the controller 30 determines whether or not steps S20 to 23 have been performed a predetermined number of times. When steps S20 to 23 have been executed a predetermined number of times (step S24: Yes), the substrate W is stored (step S25). For example, the controller 30 controls the normal pressure transfer chamber 20 and the load-lock modules LLM such that the substrates W are transferred from the load-lock modules LLM to the load ports LP by the second transfer mechanism 25. For example, in FIG. 6D, two dummy wafers DW to which moisture is attached are transferred from the load-lock modules LLM to the load port LP and stored in the FOUP. The predetermined number of times varies depending on the inner size of the storage chamber from which particles will be removed, and is set such that the particle causes, such as moisture and the like, are sufficiently removed from the storage chamber. The predetermined number of times is, e.g., preferably 5 times or more, and more preferably 10 times or more. For example, in order to sufficiently remove the particle causes from the vacuum transfer chamber 10 according to the embodiment, the predetermined number of times is set to 10 times.

On the other hand, when the steps S20 to 23 have not been executed a predetermined number of times (step S24: No), the processing proceeds to step S20 to repeatedly cool the substrate W unloaded from the vacuum transfer chamber 10 using the cooling device 63 and transfer the substrate W to the vacuum transfer chamber 10. Accordingly, the same substrate W reciprocates between the load-lock module LLM and the vacuum transfer chamber 10, so that the removal of moisture is continuously and repeatedly performed multiple times on the same substrate W. It is preferable that the cooled substrate W is transferred to different positions in the vacuum transfer chamber 10 whenever the cooling transfer process is repeated. For example, the cooled substrate W is sequentially transferred to the vicinity of the loading/unloading ports with respect to the respective process modules PM in the vacuum transfer chamber 10 and maintained for a predetermined period of time or longer whenever the cooling transfer process is repeated. Accordingly, moisture can be removed at various positions in the vacuum transfer chamber 10.

By performing the cooling transfer process shown in FIG. 5, it is possible to remove the particle causes, such as moisture and the like, from the vacuum transfer chamber 10.

The particle removal method according to the embodiment is performed when it is required to remove particles. For example, the particle removal method according to the embodiment is performed after the vacuum transfer chamber 10 that has been opened to the atmosphere is evacuated or when a large number of particles is detected in particle inspection of a product wafer or a dummy wafer.

It is preferable to remove moisture or particles from the dummy wafer DW that has been used for particle removal by performing heating or generating high-frequency plasma. For example, the substrate processing system 1 includes a cleaning chamber connected to the vacuum transfer chamber 10. The removal of moisture or the particles from the dummy wafer DW that has been used for particle removal may be performed by performing heating to a temperature of 50° C. or higher or by generating high-frequency plasma in the cleaning chamber connected to the vacuum transfer chamber 10. Further, in the substrate processing system 1, the dummy wafer DW that has been used for particle removal may be transferred to the process module PM, instead of the cleaning chamber, to be subjected to the removal of moisture or particles by performing heating or generating high-frequency plasma in the process module PM. Further, in the substrate processing system 1, a heating mechanism may be provided in the load-lock module LLM to heat the dummy wafer DW that has been used for particle removal in the load-lock module LLM to thereby remove moisture or particles.

In the substrate processing system 1 according to the embodiment, the case in which the cooling device 63 is disposed in the load-lock module LLM and the substrate W is cooled in the load-lock module LLM has been described as an example. However, the present disclosure is not limited thereto. In the substrate processing system 1, a cooling device for cooling the substrate W may be disposed in another location such as the vacuum transfer chamber 10 or the normal pressure transfer chamber 20 and cool the substrate W.

(Example Result of Particle Removal)

Next, an example result of a removal of particle causes will be described. If moisture remains in the vacuum transfer chamber 10 even after the evacuation of the vacuum transfer chamber 10 that has been opened to the atmosphere, condensation particles are generated on the substrate W by the condensation of moisture. In particular, a large amount of condensation particles is generated on the cooled substrate W. Therefore, the effect of removing particle causes generated on the cooled substrate W will be described based on the number of condensation particles.

Figure 7A:
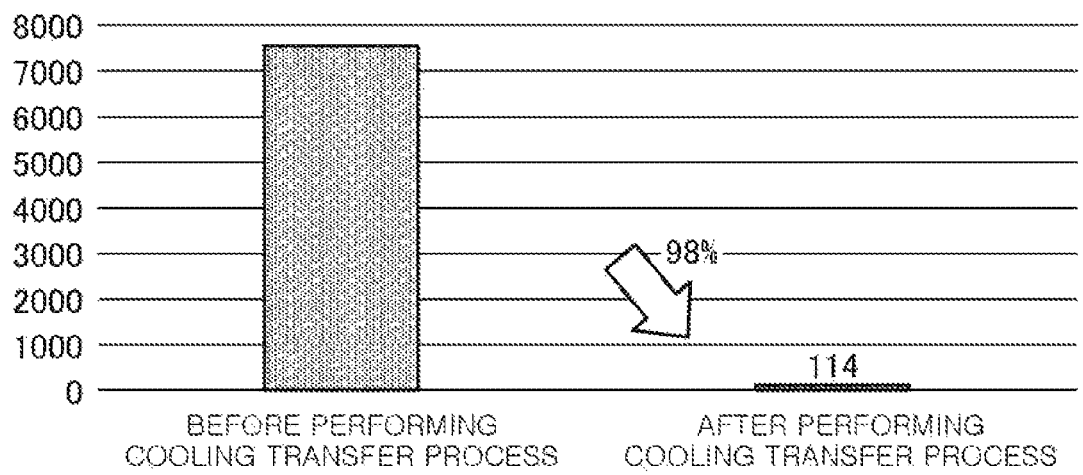
FIGS. 7A and 7B show example results of particle cause removal.

The effect of removing particle causes, such as moisture and the like, by performing the cooling transfer process only (step S13 of FIG. 3, and FIG. 5) according to the embodiment will be described. FIG. 7A shows an example result of a removal of particle causes. FIG. 7A shows a result of counting the number of condensation particles attached to the cooled substrate W. FIG. 7A shows the change in the number of condensation particles in the case of only performing the cooling transfer process. The graph on the left side of FIG. 7A shows the number of condensation particles generated on the cooled substrate W before the cooling transfer process. The graph on the right side of FIG. 7A shows the number of condensation particles generated on the cooled substrate W after the cooling transfer process. The substrate W was transferred to the load-lock module LLM, cooled by the cooling device 63, transferred to the vacuum transfer chamber 10, maintained in the vacuum transfer chamber 10 for 1 minute, and then unloaded. 7000 or more condensation particles were generated before the cooling transfer process, but the number of condensation particles decreased by 98% to 114 after the cooling transfer process. By performing the cooling transfer process, the number of condensation particles generated on the substrate W can be significantly reduced.

Figure 7B:
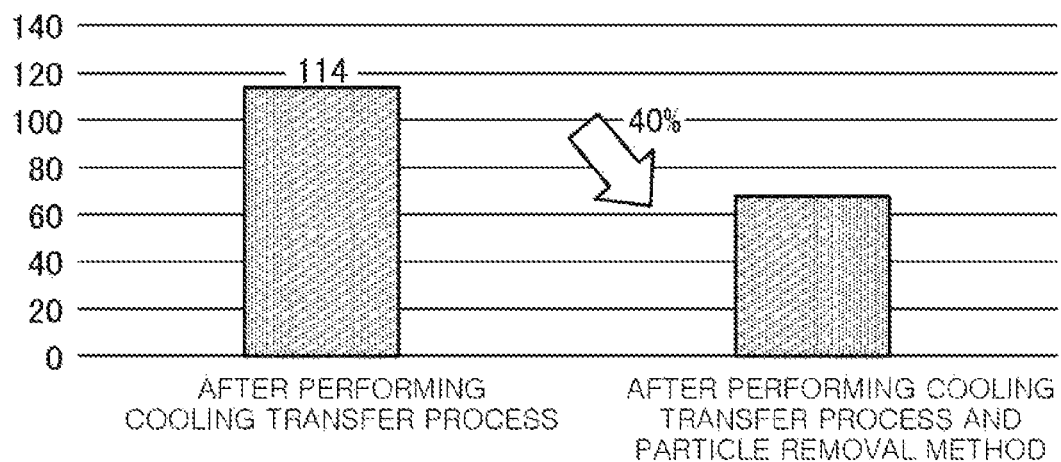

The effect of removing particle causes, such as moisture and the like, in the case of performing the particle removal method (FIG. 3) according to the embodiment will be described. FIG. 7B illustrates an example result of a removal of particle causes. FIG. 7B shows a result of counting the number of condensation particles attached to the cooled substrate W. FIG. 7B shows the change in the number of condensation particles in the case of performing the cooling transfer process in the vacuum transfer chamber 10 as shown in FIG. 7A and then performing the particle removal method according to the embodiment in the vacuum transfer chamber 10. The graph on the left side of FIG. 7B shows the number of condensation particles in the case of performing only the cooling transfer process. At this time, 114 condensation particles were generated, which is the same as that in the graph on the right side of FIG. 7A. The graph on the right side of FIG. 7B shows the number of condensation particles generated on the substrate W in the case of performing the cooling transfer process and then further performing the particle removal method according to the embodiment. The number of condensation particles was reduced by 40% by performing the particle removal method according to the embodiment. By performing the particle removal method according to the embodiment, the number of condensation particles generated on the substrate W can be further reduced compared to that in the case of performing the cooling transfer process only.

Next, the effect of removing particle causes will be described based on the number of condensation particles generated on the substrate W at room temperature.

Figure 8A:
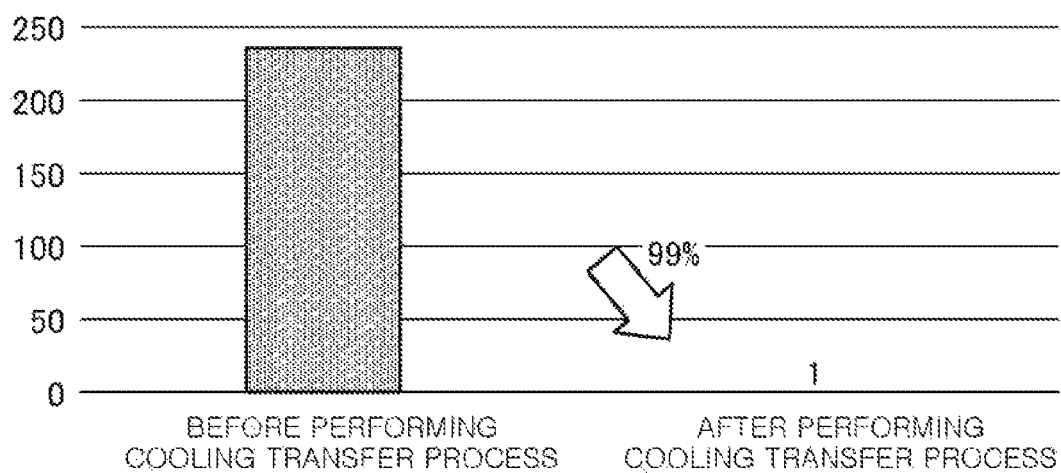
FIGS. 8A and 8B show example results of particle cause removal.

The effect of removing particle causes, such as moisture and the like, in the case of only performing the cooling transfer process (step S13 of FIG. 3, and FIG. 5) according to the embodiment will be described. FIG. 8A shows an example result of a removal of particle causes. FIG. 8A shows a result of counting the number of condensation particles attached to the substrate W at room temperature. FIG. 8A shows the change in the number of condensation particles in the case performing the cooling transfer process only. The graph on the left side of FIG. 8A shows the number of condensation particles generated on the substrate W at room temperature before the cooling transfer process. The graph on the right side of FIG. 8A shows the number of condensation particles generated on the substrate W at room temperature after the cooling transfer process. The substrate W was transferred to the vacuum transfer chamber 10 at room temperature, maintained in the vacuum transfer chamber 10 for 1 minute, and then unloaded. About 240 condensation particles were generated before the cooling transfer process, but the number of condensation particles decreased by 99% to 1 after the cooling transfer process. By performing the cooling transfer process, the number of condensation particles generated on the substrate W can be significantly reduced.

Figure 8B:
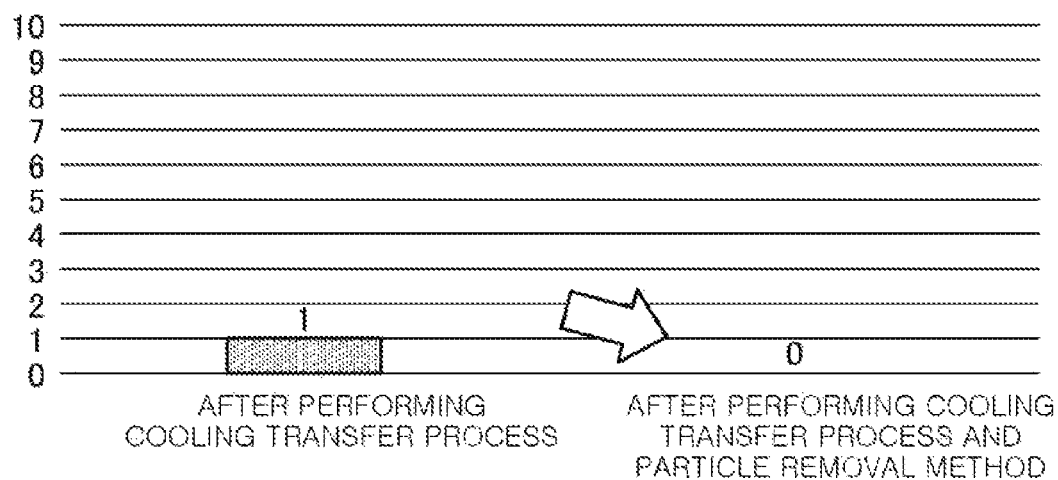

The effect of removing particle causes, such as moisture and the like, in the case of performing the particle removal method (FIG. 3) according to the embodiment will be described. FIG. 8B illustrates an example result of removing particle causes. FIG. 8B shows a result of counting the number of condensation particles attached to the substrate W at room temperature. FIG. 8B shows the change in the number of condensation particles in the case of performing the cooling transfer process in the vacuum transfer chamber as shown in FIG. 8A and then performing the particle removal method according to the embodiment in the vacuum transfer chamber 10. The graph on the left side of FIG. 8B shows the number of condensation particles in the case of only performing the cooling transfer process. At this time one condensation particle was generated, which is the same as that in in the graph on the right side of FIG. 8A. The graph on the right side of FIG. 8B shows the number of condensation particles generated on the substrate W in the case of performing the cooling transfer process and then performing the particle removal method according to the embodiment. The number of condensation particles was reduced to 0 by performing the particle removal method according to the embodiment. In the case of additionally performing the particle removal method according to the embodiment, the number of condensation particles generated on the substrate W can be further reduced, compared to the case of performing the cooling transfer process only.

Figure 9:
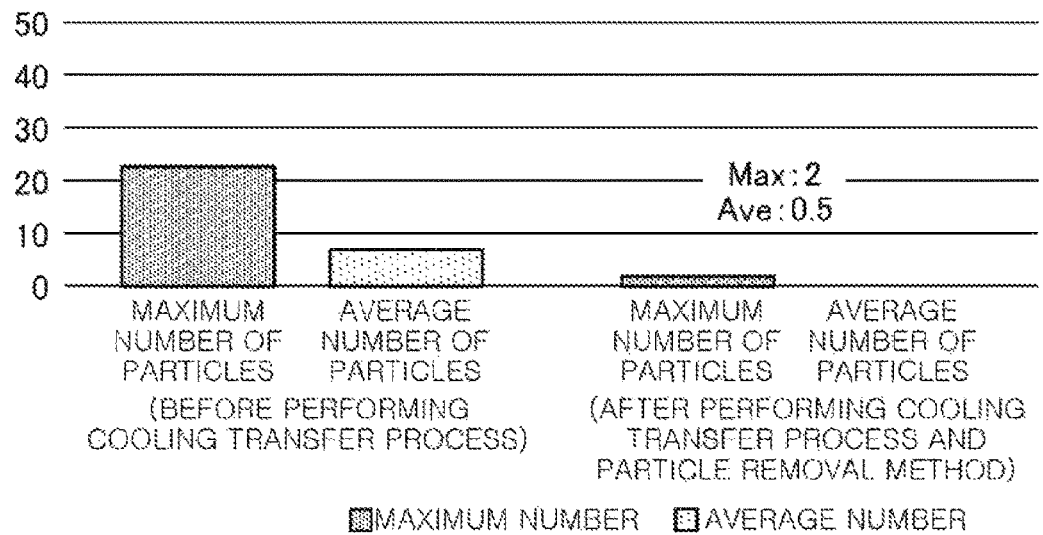
FIG. 9 shows example results of particle cause removal.

Next, the effect of removing particle causes will be described based on the number of particles, such as fine pieces and the like, other than the condensation particles generated on the substrate W. FIG. 9 shows an example result of a removal of particle causes. FIG. 9 shows a result of counting the number of particles, such as fine pieces and the like, attached to a cooled substrate W. FIG. 9 shows the change in the average of the number of particles counted at four locations on the substrate W and the change in a maximum value of the counted particles. The graph on the left side of FIG. 9 shows values obtained from the substrate W in the state corresponding to the graph on the left side of FIG. 7A, and shows the number of particles generated on the substrate W before the cooling transfer process. The graph on the right side of FIG. 9 shows values obtained from the substrate W in the state corresponding to the graph on the right side of FIG. 7B, and shows the number of particles generated on the substrate W in the case of performing the cooling transfer process and then performing the particle removal method according to the embodiment. The number of particles, such as fine pieces and the like, are also reduced by performing the cooling transfer process or the particle removal method according to the embodiment.

By performing the cooling transfer process and the particle removal method according to the embodiment, it is possible to reduce the number of particles, such as condensation particles, fine pieces, and the like, generated on the substrate W.

In the above-described embodiment, the case of removing particles in the vacuum transfer chamber 10 has been described as an example. However, the particle removal method is not limited to the removal of particles in the vacuum transfer chamber 10. The particle removal method according to the embodiment can be applied to the removal of particles in a storage chamber in a predetermined depressurized state. For example, when the process module PM is opened to the atmosphere, particles may be generated on the substrate W. Therefore, the cooled substrate W may be transferred to the process module PM and the particles in the process module PM may be removed by the particle removal method according to the embodiment. For example, the controller 30 may control the first transfer mechanism 15 to hold the cooled substrate W in the process module PM for a predetermined period of time or longer without performing the substrate processing in the process module PM and then unload the cooled substrate W from the process module PM. It is preferable to maintain a state in which the cooled substrate W is separated from the stage 51 in the process module PM in order to suppress an increase in temperature.

Figure 10:
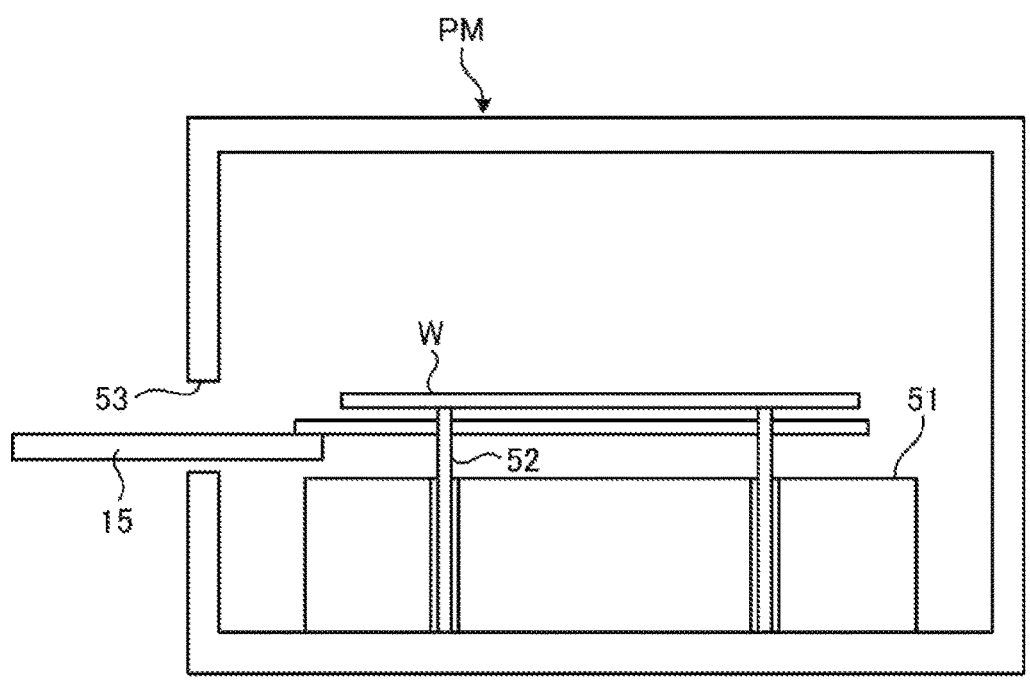
FIG. 10 shows a schematic configuration of a process module PM according to an embodiment.

FIG. 10 shows a schematic configuration of the process module PM according to the embodiment. The process module PM has therein the stage 51 for placing thereon the substrate W. The stage 51 is provided with support pins 52. The support pins 52 can be raised and lowered to raise and lower the substrate W respect to the stage 51. A loading/unloading port for loading/unloading the substrate W is formed on a sidewall of the process module PM. For example, the controller 30 controls the first transfer mechanism 15 and the support pins 52 such that the cooled substrate W is transferred into the process module PM through the loading/unloading port 53, maintained for a predetermined period of time in a state where it is separated from the stage 51 by raising the support pins 52, and then unloaded from the process module PM. Further, the controller 30 may transfer the cooled substrate W into the process module PM using the first transfer mechanism 15, maintain the substrate W held on the first transfer mechanism 15 for a predetermined period of time or longer, and then unload the substrate W from the process module PM. Further, when the stage 51 has therein a heater, the stage 51 may be heated by the heater. By heating the stage 51, particles attached to the upper surface of the stage 51 are released. The released particles are attached to the cooled substrate W on the stage 51. Accordingly, the particles attached to the upper surface of the stage 51 can be collected.

Effect of Embodiment

As described above, the substrate processing system 1 according to the embodiment includes the vacuum transfer module (the vacuum transfer chamber 10), the substrate processing modules (the process modules PM), the load-lock modules LLM, the substrate cooling stage (the cooling device 63), the substrate transfer robot (the first transfer mechanism 15), and the controller (the controller 30). Each of the substrate processing modules is connected to the vacuum transfer module and configured to process the substrate W in a depressurized environment. The load-lock modules LLM are connected to the vacuum transfer module. At least one substrate cooling stage is disposed in the load-lock module. At least one substrate transfer robot is disposed in the vacuum transfer module and has at least one end effector. The controller is configured to control the particle removal operation. The particle removal operation includes: (a) cooling at least one dummy substrate (the dummy wafer DW) placed on at least one substrate cooling stage to a first temperature of 5° C. to 20° C.; and (b) holding at least one end effector in any one of a plurality of positions in the vacuum transfer module or in the substrate processing module for a first time period of 30 seconds or longer in a state where at least one cooled dummy substrate is placed on at least one end effector. Accordingly, in the substrate processing system 1, particle causes can be removed from the storage chamber (the vacuum transfer module or the substrate processing module) without the need of providing a cooling mechanism in the storage chamber (the vacuum transfer module or the substrate processing module) from which particles will be removed.

The first temperature is 10° C. to 15° C. Accordingly, in the substrate processing system 1, the particle causes can be attached to the substrate W.

The first period is 60 seconds or more. Accordingly, in the substrate processing system 1, the particle causes can be attached to the substrate W.

The steps (a) and (b) are alternately repeated multiple times. Further, the steps (a) and (b) are alternately repeated 5 times or more. Accordingly, in the substrate processing system 1, by removing the particle causes using the same substrate W, the number of substrates W contaminated by the particle causes can be reduced.

Further, the particle removal operation includes, before the step (a), heating the substrate processing module or the vacuum transfer module for 3 hours or more. Accordingly, in the substrate processing system 1, the condensation particles, such as moisture or particles attached to the inner wall of the substrate processing module or the vacuum transfer module, can be released to the substrate W.

Further, at least one substrate cooling stage has a first substrate cooling stage and a second substrate cooling stage. At least one end effector has the first end effector and the second end effector. The particle removal operation includes: (a) cooling a first dummy substrate and a second dummy substrate respectively placed on the first substrate cooling stage and the second substrate cooling stage to the first temperature; and (b) holding the first end effector in a first position among a plurality of positions for the first time period and the second end effector in a second position among the plurality of positions for the first time period in a state where the cooled first dummy substrate and the second cooled dummy substrate are placed on the first end effector and the second end effector, respectively. Accordingly, in the substrate processing system 1, an area of a portion to which the particle causes can be attached increases, so that the particle causes can be quickly removed.

Further, the substrate processing system 1 according to the embodiment includes the vacuum transfer module (the vacuum transfer chamber 10), the substrate processing modules (the process modules PM), the substrate stage (the stage 51), the load-lock modules LLM, the substrate cooling stage (the cooling device 63), the substrate transfer robot (the first transfer mechanism 15), and the controller (the controller 30). Each of the substrate processing modules is connected to the vacuum transfer module and configured to process the substrate W in a depressurized environment. The substrate stage is disposed in the substrate processing module and includes a plurality of lifter pins (the support pins 52). The lifter pins are configured to move vertically between an upper position and a lower position. The load-lock modules LLM are connected to the vacuum transfer module. At least one substrate cooling stage is disposed in the load-lock module. At least one substrate transfer robot is disposed in the vacuum transfer module and has at least one end effector. The controller is configured to control the particle removal operation. The particle removal operation includes: (a) cooling at least one dummy substrate placed on at least one substrate cooling stage to a first temperature of 5° C. to 20° C.; (b) placing at least one cooled dummy substrate on the lifter pins which are in the upper position; and (c) maintaining a state in which at least one cooled dummy substrate is placed on the lifter pins which are in the upper position for the first time period of 30 seconds or more. Accordingly, in the substrate processing system 1, the particle causes can be removed from the storage chamber (the substrate processing module) from which particles will be removed without the need of providing a cooling mechanism in the storage chamber (the substrate processing module).

Further, the substrate processing system 1 according to the embodiment includes the first storage chambers (the vacuum transfer chamber 10 and the process modules PM, the second storage chambers (the load-lock modules LLM), the transfer device (the first transfer mechanism 15), and the controller (the controller 30). The first storage chamber is set to a predetermined depressurized state, and at least one of the transfer of the substrate W and the processing of the substrate W is performed in the first storage chamber. The second storage chamber has therein the cooling device (the cooling device 63) for cooling the substrate W. The transfer device transfers the substrate W between the first storage chamber and the second storage chamber. In the case of removing particles generated in the first storage chamber, the controller controls the transfer device such that the substrate W is transferred to the second storage chamber, cooled by the cooling device, and transferred to the first storage chamber. Accordingly, in the substrate processing system 1, the particle causes can be removed from the storage chamber (the first storage chamber) from which particles will be removed without the need of providing a cooling mechanism in the storage chamber (the first storage chamber).

Further, the controller controls the transfer device to unload the cooled substrate W from the first storage chamber after the cooled substrate W is maintained in the first storage chamber for a predetermined period of time or longer without performing the substrate processing in the first storage chamber. Accordingly, in the substrate processing system 1, the particle causes such as moisture in the first storage chamber can be attached to the substrate W and removed from the first storage chamber.

Further, the controller controls the transfer device such that a process of transferring the substrate W to the second storage chamber, a process of cooling the substrate W using the cooling device, and a process of transferring the substrate W to the first storage chamber are consecutively repeated multiple times. Accordingly, in the substrate processing system 1, the particle causes in the first storage chamber can be considerably reduced.

Further, the controller controls the transfer device to repeatedly reciprocate the same substrate W between the second storage chamber and the first storage chamber multiple times. Since the particle causes are attached to the substrate W, the number of substrates W contaminated by the particle causes can be reduced by removing the particle causes using the same substrate W.

The first storage chamber is heated. The substrate W is cooled such that a temperature difference between the substrate and the first storage chamber becomes 20° C. or more. Accordingly, in the substrate processing system 1, the particle causes can be attached to the substrate W by thermophoresis due to the temperature difference.

Further, a plurality of cooling devices are provided to cool a plurality of substrates W. The transfer device can hold and transfer the plurality of substrates W. The controller controls the transfer device to transfer the plurality of substrates W cooled by the plurality of cooling devices to the first storage chamber. Accordingly, in the substrate processing system 1, the area of the portion to which the particle causes can be attached, so that the particle causes can be quickly removed.

Further, the first storage chamber is the vacuum transfer chamber 10 for transferring the substrate W to the process module PM for performing the substrate processing. Accordingly, in the substrate processing system 1, even when the vacuum transfer chamber 10 is opened to the atmosphere, the particle causes can be removed from the vacuum transfer chamber 10 without the need of providing a cooling mechanism in the vacuum transfer chamber 10.

Further, the controller controls the transfer device such that the process of transferring the substrate W to the second storage chamber, the process of cooling the substrate W using the cooling device, and the process of transferring the cooled substrate W to different positions in the vacuum transfer chamber 10 are consecutively repeated multiple times. Accordingly, in the substrate processing system 1, the particle causes can be quickly removed from the respective positions in the vacuum transfer chamber 10, so that the particle causes in the vacuum transfer chamber 10 can be quickly reduced.

Further, the first storage chamber is the process module PM for performing the substrate processing. Accordingly, in the substrate processing system 1, even when the process module PM is opened to the atmosphere, the particle causes can be removed from the process module PM without the need of providing a cooling mechanism in the processing module PM.

Further, the process module PM has therein the stage 51 for placing thereon the substrate W, and the stage 51 is provided with an elevating mechanism (the support pins 52) for raising and lowering the substrate W with respect to the stage 51. The controller controls the transfer device and the elevating mechanism such that the substrate W is transferred to the second storage chamber, cooled by the cooling device, transferred into the process module PM, maintained in a state where it is separated from the stage 51 by raising the elevating mechanism, and then unloaded from the process module PM. Accordingly, in the substrate processing system 1, the particle causes can be attached to both sides of the substrate W, so that the particle causes can be quickly removed.

While the embodiments of the present disclosure have been described, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiment, the case in which the substrate W is a semiconductor wafer has been described as an example. However, the present disclosure is not limited to thereto, and the substrate may be any substrate.

Further, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing system comprising:
a vacuum transfer module;
a substrate processing module connected to the vacuum transfer module and configured to process a substrate in a depressurized environment;
a normal pressure transfer chamber;
a load-lock module connected to the vacuum transfer module and the normal pressure transfer chamber;
at least one substrate cooling stage disposed in the load-lock module;
at least one substrate transfer robot disposed in the vacuum transfer module and having at least one end effector; and
a controller configured to control a particle removal operation,
wherein the particle removal operation includes:
(a) cooling at least one dummy substrate placed on said at least one substrate cooling stage in the load-lock module to a first temperature of 5° C. to 20° C.; and
(b) holding said at least one end effector in any one of a plurality of positions in the vacuum transfer module for a first time period of 30 seconds or longer in a state where at least one cooled dummy substrate is placed on said at least one end effector,
wherein the controller performs said holding (b) after performing said cooling (a), and
during said holding (b), particles within the vacuum transfer module are attached to said at least one cooled dummy substrate.

2. The substrate processing system of claim 1, wherein the first temperature is 10° C. to 15° C.

3. The substrate processing system of claim 1, wherein the first time period is 60 seconds or more.

4. The substrate processing system of claim 1, wherein said cooling (a) and said holding (b) are alternately repeated multiple times.

5. The substrate processing system of claim 1, wherein said cooling (a) and said holding (b) are alternately repeated 5 times or more.

6. The substrate processing system of claim 1, comprising:
a heater, wherein
the controller performs the particle removal operation by, prior to said cooling (a), controlling the heater to heat the substrate processing module or the vacuum transfer module for 3 hours or more.

7. The substrate processing system of claim 1, further comprising:
a second substrate cooling stage disposed in a second load-lock module, wherein
said at least one end effector has a first end effector and a second end effector, and
the particle removal operation includes:
(a) cooling a first dummy substrate and a second dummy substrate respectively placed on the at least one substrate cooling stage and the second substrate cooling stage to the first temperature; and
(b) holding the first end effector in a first position among the plurality of positions for the first period and the second end effector in a second position among the plurality of positions for the first period in a state where the cooled first dummy substrate and the cooled second dummy substrate are placed on the first end effector and the second end effector, respectively.

8. A particle removal method for the substrate processing system of claim 1,
the particle removal method comprising:
(a) cooling at least one dummy substrate placed on the at least one substrate cooling stage to a first temperature of 5° C. to 20° C.
(b) holding said at least one end effector in any one of a plurality of positions in the vacuum transfer module or in the substrate processing module for a first time period of 30 seconds or more in a state where at least one cooled dummy substrate is placed on said at least one end effector.

9. The substrate processing system of claim 1, wherein particles removed by the particle removal operation include particles generated by condensation of moisture.

10. The substrate processing system of claim 1, wherein the particle removal operation is performed after the vacuum transfer module is opened to the atmosphere and then is evacuated.

11. The substrate processing system of claim 1, wherein said at least one dummy substrate that has been used in the particle removal operation is heated to 50° C. or higher in a cleaning chamber connected to the vacuum transfer module to thereby remove particles.

12. The substrate processing system of claim 1, wherein particles are removed from said at least one dummy substrate that has been used in the particle removal operation by generating high-frequency plasma in a cleaning chamber connected to the vacuum transfer module.

13. The substrate processing system of claim 1, wherein
the controller performs the particle removal operation by, prior to said cooling (a), controlling a heater to heat the substrate processing module or the vacuum transfer module for 3 hours or more.

14. The substrate processing system of claim 1, wherein, in said cooling (a), said at least one dummy substrate is cooled at an atmospheric atmosphere.

15. The substrate processing system of claim 1, wherein one of the plurality of positions in the vacuum transfer module is in the vicinity of a loading and unloading port in the vacuum transfer module with respect to the substrate processing module.

16. The substrate processing system of claim 4, wherein
the substrate system comprises a plurality of substrate processing modules including said substrate processing module, and
in each iteration where said cooling (a) and said holding (b) are repeated, said at least one cooled dummy substrate placed on said at least one end effector is sequentially transferred to different positions in the vicinity of a plurality of loading and unloading ports with respect to respective substrate processing modules of the plurality of substrate processing modules in the vacuum transfer module and held for a predetermined period of time or longer.

17. The substrate processing system of claim 5, wherein
the substrate system comprises a plurality of substrate processing modules including said substrate processing module, and
in each iteration where said cooling (a) and said holding (b) are repeated, said at least one cooled dummy substrate placed on said at least one end effector is sequentially transferred to different positions in the vicinity of a plurality of loading and unloading ports with respect to respective substrate processing modules of the plurality of substrate processing modules in the vacuum transfer module and held for a predetermined period of time or longer.

18. The substrate processing system of claim 7, wherein the first position is in the vicinity of a loading and unloading port in the vacuum transfer module with respect to the substrate processing module, and the second position is in the vicinity of a central portion in the vacuum transfer module.

19. The substrate processing system of claim 7, wherein said cooling (a) and said holding (b) are alternately repeated multiple times.

20. The substrate processing system of claim 7, wherein said cooling (a) and said holding (b) are alternately repeated 5 times or more.

21. The substrate processing system of claim 7, wherein the particle removal operation includes, prior to said cooling (a), heating the substrate processing module or the vacuum transfer module for 3 hours or more.

22. A substrate processing system comprising:
a vacuum transfer module;
a substrate processing module connected to the vacuum transfer module and configured to process a substrate in a depressurized environment;
a substrate stage disposed in the substrate processing module and including a plurality of lifter pins configured to move vertically between an upper position and a lower position;
a normal pressure transfer chamber;
a load-lock module connected to the vacuum transfer module and the normal pressure transfer chamber;
at least one substrate cooling stage disposed in the load-lock module;
at least one substrate transfer robot disposed in the vacuum transfer module and having at least one end effector; and
a controller configured to control a particle removal operation including:
(a) cooling at least one dummy substrate placed on the at least one substrate cooling stage in the load-lock module to a first temperature of 5° C. to 20° ° C.;
(b) placing at least one cooled dummy substrate on the plurality of lifter pins which are in the upper position; and
(c) maintaining a state in which said at least one cooled dummy substrate is placed on the plurality of lifter pins which are in the upper position for a first period of 30 seconds or more,
wherein the controller performs said placing (b) and maintaining (c) after performing said cooling (a), and
during said maintaining (c), particles within the substrate processing module are attached to said at least one cooled dummy substrate.

23. A particle removal method for the substrate processing system of claim 22,
the particle removal method comprising:
(a) cooling at least one dummy substrate placed on the said at least one substrate cooling stage to a first temperature of 5° C. to 20° ° C.;
(b) placing at least one cooled dummy substrate on the plurality of lifter pins which are in the upper position; and
(c) maintaining a state in which said at least one cooled dummy substrate is placed on the plurality of lifter pins which are in the upper position for a first time period of 30 seconds or more.

24. The substrate processing system of claim 22, wherein, in said cooling (a), said at least one dummy substrate is cooled at an atmospheric atmosphere.

* * * * *